(12) United States Patent
Chen et al.

(10) Patent No.: US 8,890,288 B2
(45) Date of Patent: Nov. 18, 2014

(54) MOM CAPACITOR HAVING LOCAL INTERCONNECT METAL PLATES AND RELATED METHOD

(75) Inventors: Xiangdong Chen, Irvine, CA (US); Henry Kuo-Shun Chen, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 13/270,452

(22) Filed: Oct. 11, 2011

(65) Prior Publication Data

US 2013/0087886 A1 Apr. 11, 2013

(51) Int. Cl.
*H01L 21/02* (2006.01)
*H01L 23/522* (2006.01)
*H01L 27/06* (2006.01)
*H01L 49/02* (2006.01)

(52) U.S. Cl.
CPC ............ *H01L 28/86* (2013.01); *H01L 23/5223* (2013.01); *H01L 27/0629* (2013.01)
USPC .................................. 257/532; 257/E29.002

(58) Field of Classification Search
CPC .............. H01L 23/5223; H01L 28/40; H01L 21/02104; H01L 21/02532; H01L 29/786; H01L 27/105; H01L 27/11521; H01L 27/11568

USPC ............ 257/532, E29.002, E21.008; 438/381
See application file for complete search history.

(56) References Cited

U.S. PATENT DOCUMENTS

| 6,383,858 | B1* | 5/2002 | Gupta et al. .................. 438/238 |
| 2001/0017402 | A1* | 8/2001 | Usami ........................... 257/642 |
| 2004/0174655 | A1 | 9/2004 | Tsai et al. |
| 2007/0034988 | A1* | 2/2007 | Won et al. ..................... 257/532 |
| 2008/0006868 | A1* | 1/2008 | Hsu et al. ...................... 257/314 |
| 2009/0090951 | A1* | 4/2009 | Chang et al. .................. 257/306 |
| 2010/0187655 | A1* | 7/2010 | Choi et al. .................... 257/532 |
| 2011/0049589 | A1* | 3/2011 | Chuang et al. ................ 257/292 |
| 2013/0140573 | A1* | 6/2013 | Nakamura ...................... 257/59 |

* cited by examiner

*Primary Examiner* — Duy T Nguyen
(74) *Attorney, Agent, or Firm* — Oblon, Spivak, McClelland, Maier & Neustadt, L.L.P.

(57) ABSTRACT

According to one exemplary embodiment, a metal-oxide-metal (MOM) capacitor in a semiconductor die comprises a first plurality of capacitor plates and a second plurality of capacitor plates sharing a plane parallel to and below a plane of a first metallization layer of the semiconductor die. The MOM capacitor further comprises a local interlayer dielectric between the first plurality of capacitor plates and the second plurality of capacitor plates. The first and second plurality of capacitor plates are made from a local interconnect metal for connecting devices formed in a device layer of the semiconductor die situated below the first metallization layer.

10 Claims, 5 Drawing Sheets

US 8,890,288 B2

MOM CAPACITOR HAVING LOCAL INTERCONNECT METAL PLATES AND RELATED METHOD

BACKGROUND OF THE INVENTION

1. Field of the Invention

The present invention is generally in the field of semiconductors. More particularly, the invention is in the field of fabrication of capacitors in semiconductor dies.

2. Background Art

Metal-oxide-metal (MOM) capacitors have been used extensively in the fabrication of integrated analog and mixed signal circuits on semiconductor dies. A MOM capacitor typically includes an oxide dielectric situated between adjacent metal plates, which form the electrodes of the MOM capacitor. Conventionally, MOM capacitors are fabricated on semiconductor dies during back-end-of-line (BEOL) processing.

In the conventional approach, MOM capacitors are fabricated in the otherwise unused space available between routing metallization layers in a semiconductor die, during BEOL processing. However, the low dielectric constant (low-κ) of the dielectric materials typically present between routing metallization layers, such as materials having dielectric constants less than 3.0, for example, result in conventional MOM capacitors having relatively low capacitance densities. Although specialized dielectric materials can be use to form the MOM capacitor dielectric during BEOL, that alternative approach can require additional process steps and masks beyond those normally required for complementary metal-oxide-semiconductor (CMOS) fabrication process flows, which can undesirably increase manufacturing cost. Moreover, although it is desirable in principle to fabricate MOM capacitors having higher capacitance densities, situating such MOM capacitors between routing metallization layers formed over the device layer in which active devices are fabricated can adversely affect device performance, such as the speed of CMOS logic devices, for example.

Thus, there is a need to overcome the drawbacks and deficiencies in the conventional art by providing a MOM capacitor capable of achieving a higher capacitance density while being compatible with standard CMOS fabrication materials and process flows.

SUMMARY OF THE INVENTION

The present application is directed to a metal-oxide-metal (MOM) capacitor having local interconnect metal plates and related method, substantially as shown in and/or described in connection with at least one of the figures, and as set forth more completely in the claims.

DETAILED DESCRIPTION OF THE INVENTION

Figure 1:
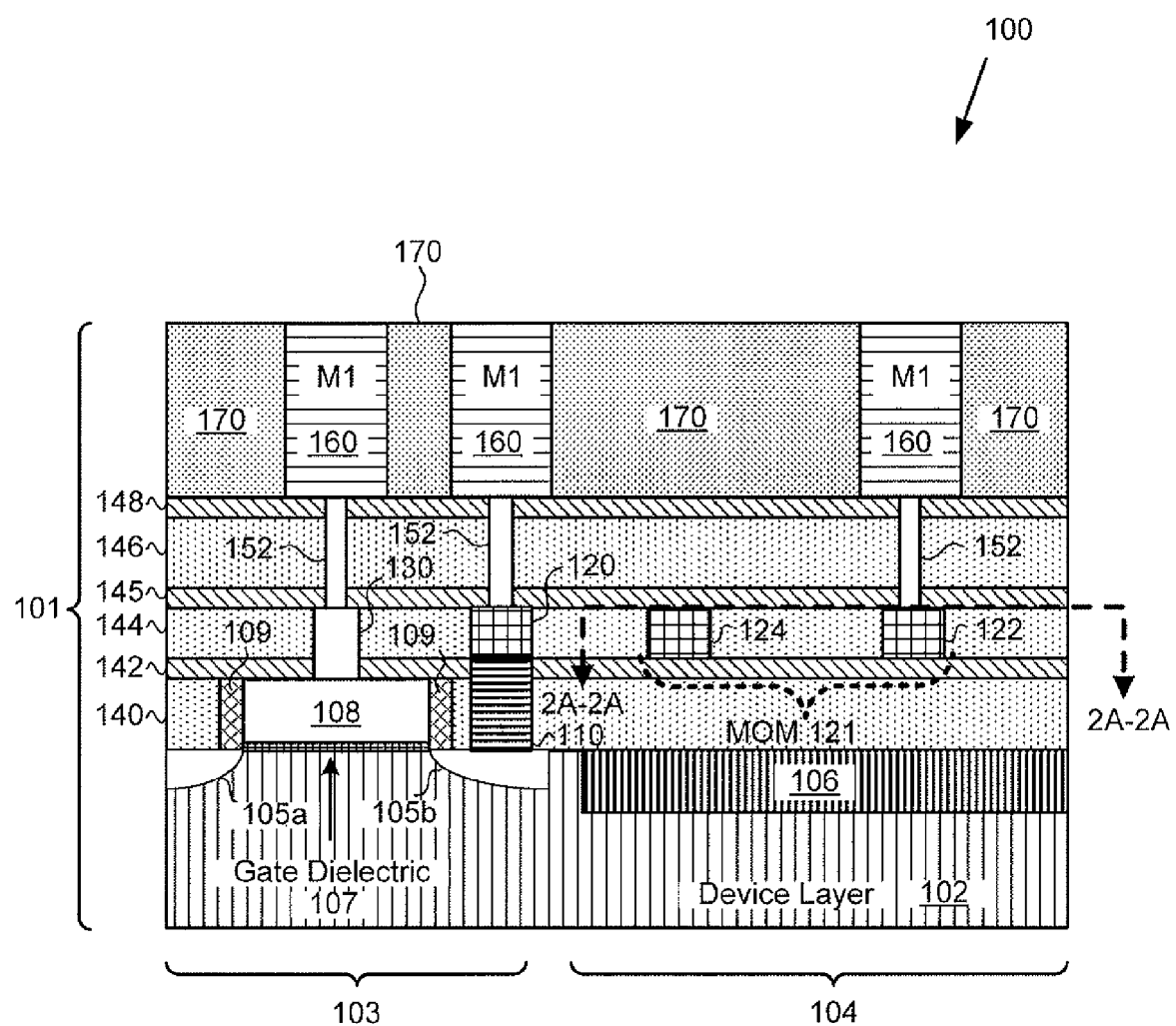
FIG. 1 shows a cross-sectional view of a portion of a semiconductor die including a metal-oxide-metal (MOM) capacitor having local interconnect metal plates, according to one embodiment of the present invention.

The present application is directed to a metal-oxide-metal (MOM) capacitor having local interconnect metal plates and related method. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of structure 100, which includes a portion of semiconductor die 101 including MOM capacitor 121 having local interconnect metal plates 122 and 124, according to one embodiment of the present invention. It is noted that structure 100 may be seen to correspond to a portion of a processed semiconductor die, which may include, among other features, a substrate, such as a group IV semiconductor substrate, a device layer, such as device layer 102, formed over the substrate, and isolation regions, such as isolation region 106.

As shown in FIG. 1, device layer 102, which can be an epitaxial semiconductor layer comprising silicon or germanium, for example, includes field-effect transistor (FET) region 103 and MOM capacitor region 104. FET region 103 and MOM capacitor region 104 are regions of device layer 102 that are designated for FET and MOM capacitor formation, respectively. As shown in FIG. 1, according to the present embodiment, FET region 103 of device layer 102 includes source/drain regions 105a and 105b, gate dielectric layer 107, and gate 108 bordered by insulating bodies 109, while MOM capacitor region 104 includes isolation region 106, which can be, for example, a shallow trench isolation (STI) region formed in device layer 102. Isolation region 106 can comprise silicon oxide ($SiO_2$) or any other suitable dielectric material for formation of isolation region 106, and insulating bodies 109 can comprise any suitable dielectric, such as $SiO_2$ or silicon nitride ($Si_3N_4$), for example.

Device layer 102 including FET region 103 and MOM capacitor region 104 is situated below first metallization segments 160, which may be formed from an "M1" layer of semiconductor die 101, for example, providing routing metallization and fabricated during back-end-of-line (BEOL) processing of semiconductor die 101. It is noted that first metallization segments 160 are separated by dielectric bodies 170, which may comprise low dielectric constant (low-κ) dielectric bodies having a dielectric constant of approximately 2.55, for example. Situated between device layer 102 and first metallization segments 160 are a series of local interlayer dielectrics, shown as local interlayer dielectric layers 140, 142, 144, 145, 146, and 148, in FIG. 1. Local interlayer dielectric layers 140, 142, 144, 145, 146, and 148 may comprise alternating layers of $SiO_2$ and $Si_3N_4$ having thicknesses in a range of approximately two hundred angstroms (200 Å) to approximately 2000 Å, for example. As a specific example provided merely to aid in a conceptual grasp of the present inventive principles, local interlayer dielectric layers 140, 144, and 146 may be $SiO_2$ layers having thicknesses of approximately 1000 Å, while local interlayer dielectric layers 142, 145, and 148 may be $Si_3N_4$ layers having thicknesses of approximately 300 Å.

Structure 100 further comprises lower local interconnect metal body 110, local interconnect metal body 120 formed over lower local interconnect metal body 110, local interconnect metal body 130 formed over gate 108, and MOM capacitor plates 122 and 124 formed from a local interconnect metal. For the purposes of the present application, the feature "local interconnect metal" refers to a metal utilized to form short distance connections between and among devices formed in device layer 102, as well as to facilitate vertical connection of such devices to overlying first metallization segments 160. A local interconnect metal may comprise copper (Cu), for example, or a refractory metal such as tungsten (W). Thus, lower local interconnect metal body 110, local interconnect metal body 120, local interconnect metal body 130, and local interconnect metal plates 122 and 124 of MOM capacitor 121 may comprise copper or a refractory metal such as tungsten, for example.

Lower local interconnect metal body 110, local interconnect metal body 120, local interconnect metal body 130, and local interconnect metal plates 122 and 124 of MOM capacitor 121 can be formed, for example, by appropriate patterning of local interlayer dielectric layers 140, 142, and 144. For example, lower local interconnect metal body 110 can be formed by patterning local interlayer dielectric layers 142 and 140. During the patterning process, which can include a masking step and an etch step, a portion of local interlayer dielectric layer 142 and a corresponding portion of local interlayer dielectric layer 140 can be removed to expose source/drain region 105b. Lower local interconnect metal body 110 may then be formed in the opening produced thereby using any suitable deposition technique. Local interconnect metal body 130 may be analogously formed through patterning of interlayer dielectric layers 144 and 142 to expose a portion of gate 108. Moreover, and as may be apparent from FIG. 1, according to the present embodiment, local interconnect metal body 120 and local interconnect metal plates 122 and 124 of MOM capacitor 121 can be formed concurrently from the same local interconnect metal through appropriate patterning of local interlayer dielectric layer 144, using a process that treats interlayer dielectric layer 142 as an etch stop surface.

Lower local interconnect metal body 110 is situated over and makes electrical contact with source/drain region 105b adjacent gate 108, and local interconnect metal body 120 is formed over and makes electrical contact with lower local interconnect metal body 110, while local interconnect metal body 130 is formed so as to make electrical contact with gate 108. It is understood that source/drain regions 105a and 105b and gate 108 are part of a transistor fabricated in FET region 103, such that source/drain regions 105a and 105b serve as transistor source/drain regions. Thus, according to the embodiment shown in FIG. 1, lower local interconnect metal body 110 and local interconnect metal body 120 are configured to provide a source/drain connection for the transistor comprising source/drain regions 105a and 105b and gate 108, while local interconnect metal body 130 is implemented to serve as a gate connection for that device. Moreover, it is noted that the local interconnect metals used respectively to form lower local interconnect metal body 110 and local interconnect body 120 can be further implemented to connect source/drain region 105b to source drain regions of other devices formed in semiconductor die 101. In analogous manner, the local interconnect metal used to form local interconnect metal body 130 can be further implemented to connect gate 108 to gates of other devices formed in semiconductor die 101.

Vertical contacts for connecting gate 108, source/drain region 105b, and MOM capacitor 121 to first metallization segments 160 can be formed in local interlayer dielectric layers 145, 146, and 148 by etching vias 152 in local interlayer dielectric layers 145, 146, and 148 and filling vias 152 with tungsten or other metal or metal stack, as is known in the art. Moreover, first metallization segments 160 can comprise, for example, a metal such as aluminum or copper and can be formed by depositing and patterning a first metallization layer over device layer 102 and local interlayer dielectric layers 140, 142, 144, 145, 146, and 148 in a manner known in the art.

Figure 2A:
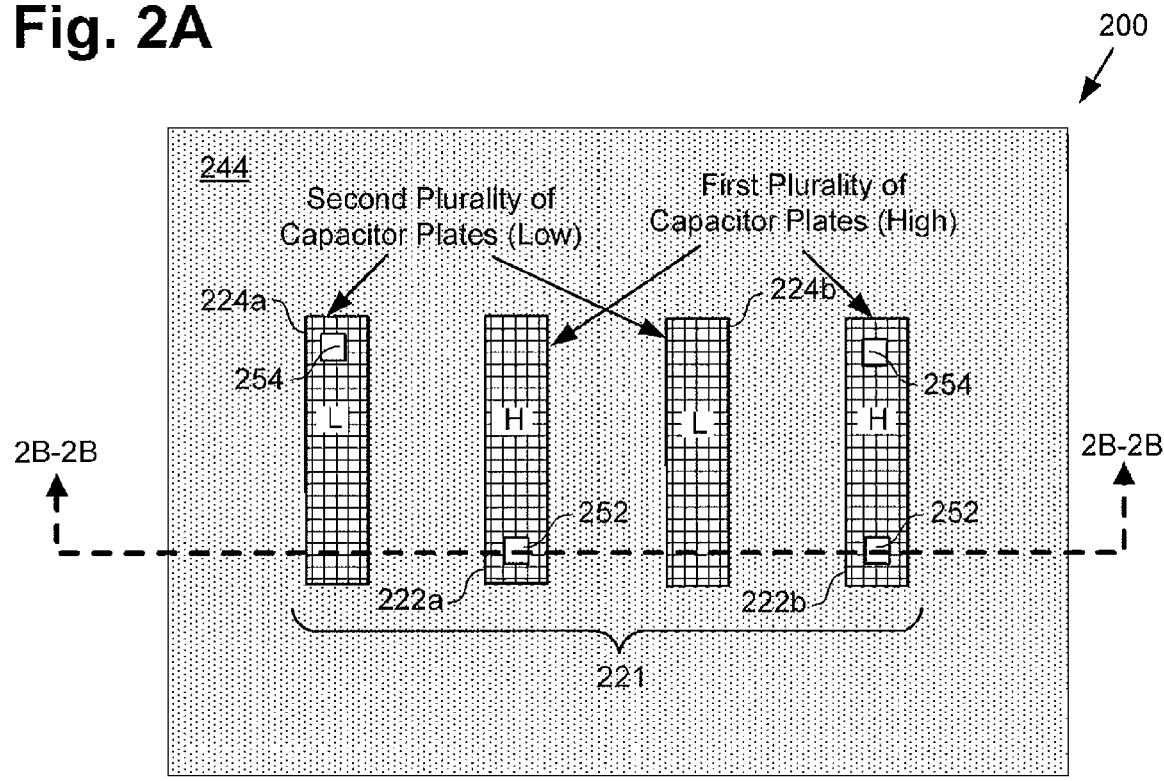
FIG. 2A shows a top view of a portion of a semiconductor die including a MOM capacitor having local interconnect metal plates along perspective line 2A-2A in FIG. 1, according to one embodiment of the present invention.
Figure 2B:
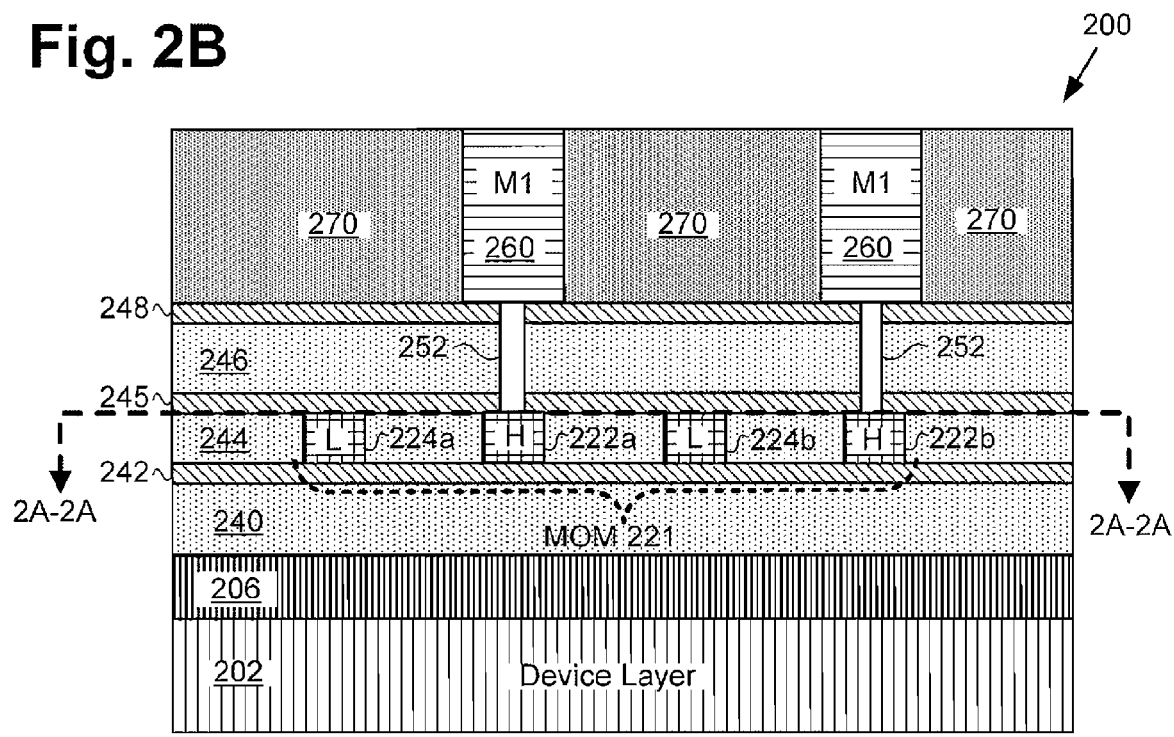
FIG. 2B shows a cross-sectional view of the embodiment of FIG. 2A along perspective line 2B-2B in FIG. 2A.

The advantages associated with various embodiments of the present invention will be further described in conjunction with FIGS. 2A, 2B, 3A, 3B, 4A, 4B, 5A, and 5B of the present application. Referring first to FIGS. 2A and 2B, FIG. 2A shows a top view of structure 200 corresponding to a portion of a semiconductor die including MOM capacitor 221 having local interconnect metal plates 222a, 224a, 222b, and 224b, along perspective line 2A-2A in FIG. 1, according to one embodiment of the present invention. In addition, FIG. 2B shows a cross-sectional view of structure 200 along perspective line 2B-2B in FIG. 2A. FIG. 2B also shows perspective line 2A-2A corresponding to the top view shown in FIG. 2A as well as to perspective line 2A-2A in FIG. 1.

It is noted that the portion of semiconductor die 101, in FIG. 1, represented by structure 200, in FIGS. 2A and 2B, corresponds to MOM capacitor region 104, in FIG. 1, and depicts more of MOM capacitor region 104 than is shown by structure 100. Thus, it may be understood that local interconnect metal plates 222a and 224a of MOM capacitor 221, in FIGS. 2A and 2B, correspond respectively to local interconnect metal plates 122 and 124 of MOM capacitor 121, in FIG. 1, while local interconnect metal plates 222b and 224b, in FIGS. 2A and 2B, are situated in a portion of MOM capacitor region 104, in FIG. 1, that is out of view in FIG. 1.

In addition to local interconnect metal plates 222a, 224a, 222b, and 224b of MOM capacitor 221, FIG. 2A shows a top surface of local interlayer dielectric 244, cross-sections of vias 252 at substantially their respective points of contact with local interconnect metal plates 222a and 222b, and cross-sections of vias 254 at substantially their respective points of contact with local interconnect metal plates 224a and 224b. Local interlayer dielectric 244 and vias 252 correspond respectively to local interlayer dielectric layer 144 and via 152 in contact with local interconnect metal plate 122, in FIG. 1. It is noted that vias 254 in contact with local interconnect metal plates 224a and 224b, shown in FIG. 2A, correspond to features that may be present in structure 100 of FIG. 1, but are out of view from the perspective of FIG. 1, and are also out of view in FIG. 2B. In addition to the features shown in FIG. 2A, FIG. 2B shows device layer 202, isolation region 206, local interlayer dielectrics 240, 242, 245, 246, and 248, first metallization segments 260, and dielectric bodies 270 of structure 200, corresponding respectively to device layer 102, isolation region 106, local interlayer dielectric layers 140, 142, 145, 146, and 148, first metallization segments 160, and dielectric bodies 170 of structure 100, in FIG. 1.

As shown in FIG. 2A, MOM capacitor 221 comprises a first plurality of capacitor plates, e.g., local interconnect metal plates 222a and 222b identified as high terminal plates of MOM capacitor 221 in the present embodiment. In addition, MOM capacitor 221 comprises a second plurality of capacitors plates, e.g., local interconnect metal plates 224a and 224b identified as low terminal plates of MOM capacitor 221 in the present embodiment. As may be seen from FIGS. 2A and 2B, local interconnect metal plates 222a, 224a, 222b, and 224b share a plane parallel to and below the plane of a first metallization layer from which first metallization segments 260 are formed. That is to say, from the perspective shown by FIG. 2B, the plane shared by first metallization segments 260 and the parallel plane shared by local interconnect metal plates 222a, 224a, 222b, and 224b and situated below the plane shared by first metallization segments 260 lie substantially perpendicular to the page occupied by FIGS. 2A and 2B. Moreover, it is noted that according to the embodiment shown by FIGS. 2A and 2B, local interconnect metal plates 222a, 224a, 222b, and 224b are formed so as to be situated over isolation region 206, which is formed in device layer 202, as also shown in FIG. 1.

As further shown in FIGS. 2A and 2B, local interlayer dielectric 244 is disposed between the first plurality of capacitor plates represented by local interconnect metal plates 222a and 222b, and the second plurality of capacitor plates represented by local interconnect metal plates 224a and 224b. Consequently, local interlayer dielectric 244 is utilized as a capacitor dielectric for MOM capacitor 221. In one embodiment, for example, as discussed above, local interlayer dielectric 244 may comprise $SiO_2$, in which case a dielectric constant associated with the capacitor dielectric utilized in MOM capacitor 221 would be substantially equal to approximately 3.9.

As noted above, local interconnect metal plates 222a, 224a, 222b, and 224b are formed from a local interconnect metal utilized to form short distance connections between and among devices formed in device layer 202, as well as to facilitate vertical connection of those devices to overlying first metallization segments 260, and may comprise copper or a refractory metal such as tungsten. In one embodiment, for example, the local interconnect metals used to form tower local interconnect metal body 110, local interconnect metal body 120, and local interconnect metal body 130, in FIG. 1, may serve specific functions at a particular technology node. For instance, at the 20.0 nanometer (20 nm) node, a local interconnect metal or metals used to form lower local interconnect metal body 110 and local interconnect metal body 120 may typically be utilized in a middle-of-the-line (MEOL) process to provide source/drain connections for devices formed in device layer 102. According to embodiments of the present invention, however, at least one local interconnect metal, e.g., the local interconnect metal used to form local interconnect metal body 120, can additionally be advantageously used to fabricate local interconnect metal plates 222a, 224a, 222b, and 224b of MOM capacitor 221.

MOM capacitor 221 is situated between first metallization segments 260 (e.g., segments formed from a first routing metallization layer of structure 200, fabricated during BEOL processing) and device layer 202. Thus, both the high and low terminal electrodes of MOM capacitor 221 are formed of a local interconnect metal used below first metallization segments 260 during MEOL processing. In addition, use of a local interlayer dielectric, such as local interlayer dielectric 244, as the capacitor dielectric for MOM capacitor 221, renders a process for forming MOM capacitor 221 compatible with standard MEOL fabrication processing steps for advanced process technologies, such as 20 nm and smaller complementary metal-oxide-semiconductor (CMOS) process technologies, for example.

As explained above, according to the present embodiment, MOM capacitor 221 is situated over isolation region 206. In addition, the embodiment shown in FIG. 2B achieves additional isolation and noise protection by providing local interlayer dielectrics 240 and 242 between MOM capacitor 221 and device layer 202. Furthermore, by utilizing a local interlayer dielectric having a dielectric constant of approximately 3.9, or greater if local interlayer dielectric 244 comprises $Si_3N_4$, for example, MOM capacitor 221 can achieve a capacitance density greater than that achievable by conventional MOM capacitors formed between routing metallization layers in a semiconductor die during BEOL processing and utilizing the low-κ dielectric materials typically formed in those regions as the MOM capacitor dielectric.

Figure 3A:
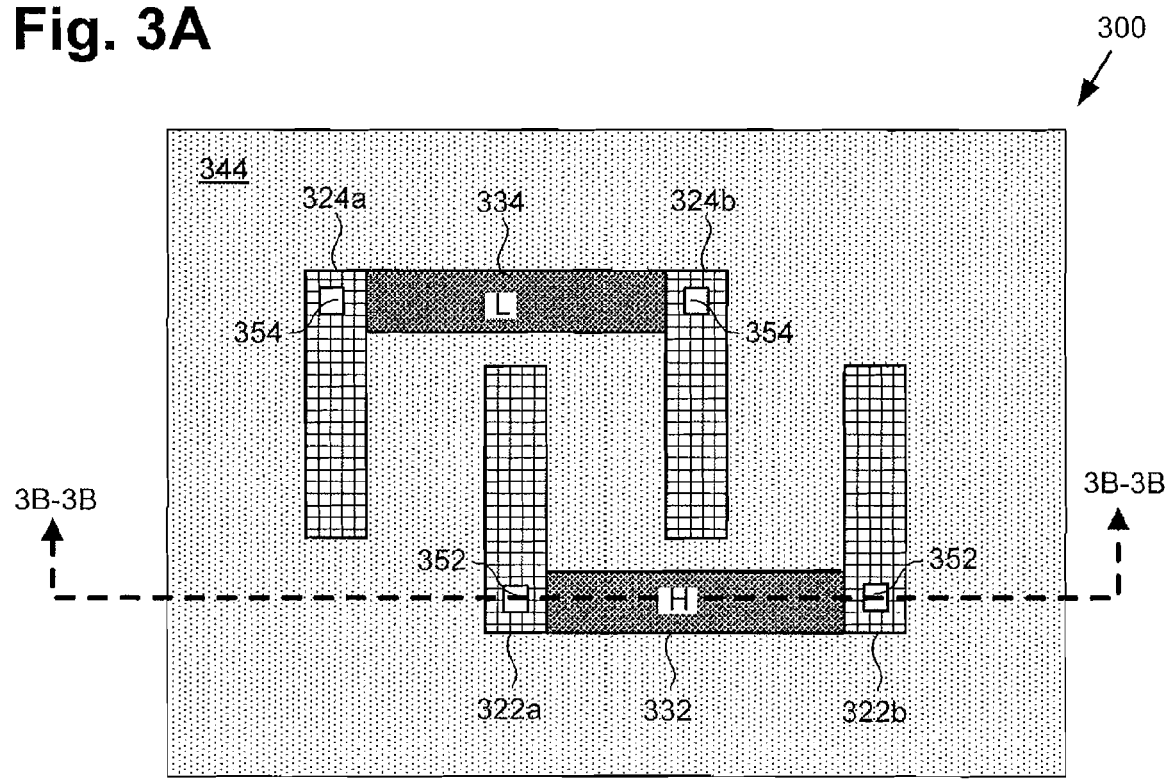
FIG. 3A shows a top view of a portion of a semiconductor die including a MOM capacitor having local interconnect metal plates, according to another embodiment of the present invention.
Figure 3B:
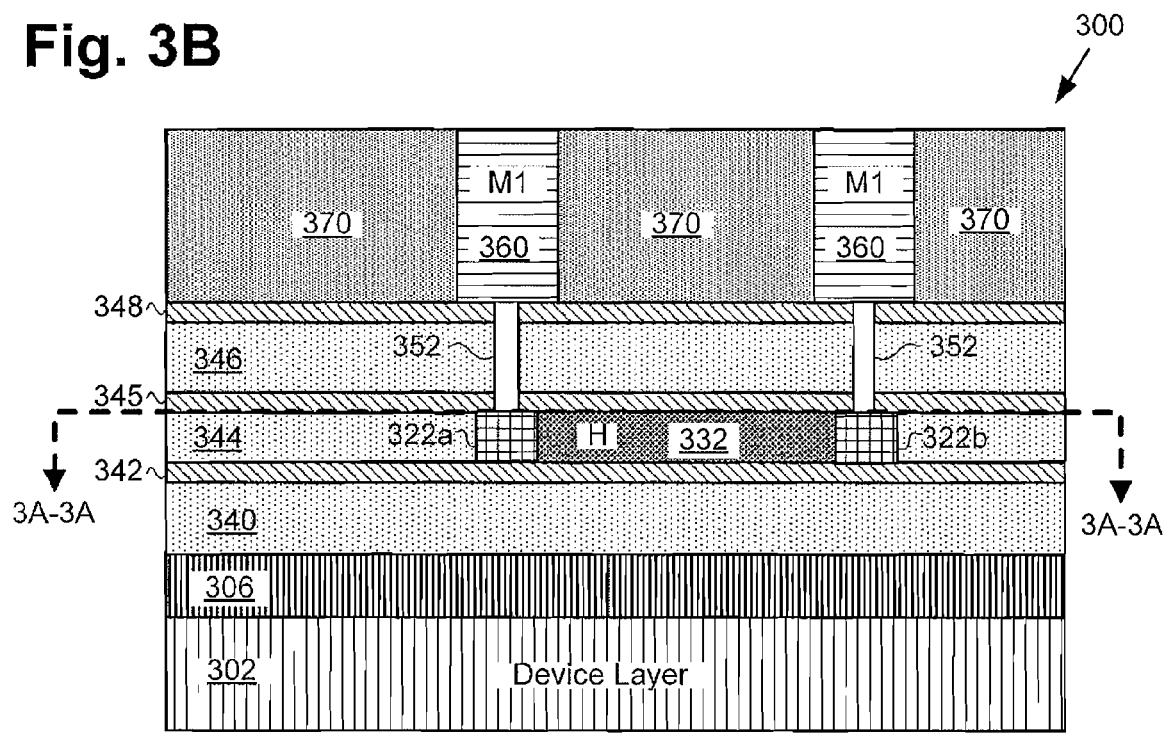
FIG. 3B shows a cross-sectional view of the embodiment of FIG. 3A along perspective line 3B-3B in FIG. 3A.

Moving now to FIGS. 3A and 3B, FIG. 3A shows a top view of structure 300 corresponding to a portion of a semiconductor die including a MOM capacitor having local interconnect metal plates 322a, 324a, 322b, and 324b, according to another embodiment of the present invention, while FIG. 3B shows a cross-sectional view of structure 300 along perspective line 3B-3B in FIG. 3A. FIG. 3B also shows perspective line 3A-3A corresponding to the top view shown in FIG. 3A.

In addition to local interconnect metal plates 322a, 324a, 322b, and 324b, FIG. 3A shows a top surface of local interlayer dielectric 344, cross-sections of vias 352 at substantially their respective points of contact with local interconnect metal plates 322a and 322b, and cross-sections of vias 354 at substantially their respective points of contact with local interconnect metal plates 324a and 324b, as well as capacitor runner 332 interconnecting local interconnect metal plates 322a and 322b, and capacitor runner 334 interconnecting local interconnect metal plates 324a and 324b. Local interconnect metal plates 322a, 324a, 322b, and 324b, local interlayer dielectric 344, vias 352, and vias 354 correspond respectively to local interconnect metal plates 222a, 224a, 222b, and 224b, local interlayer dielectric 244, vias 252, and vias 254, in FIGS. 2A and 2B. Moreover, it is noted that device layer 302, isolation region 306, local interlayer dielectrics 340, 342, 345, 346, and 348, first metallization segments 360, and dielectric bodies 370 of structure 300, shown in FIG. 3B, correspond respectively to device layer 202, isolation region 206, local interlayer dielectrics 240, 242, 245, 246, and 248, first metallization segments 260, and dielectric bodies 270, in FIG. 2B, and may share the characteristics previously attributed to those features, as described in detail above.

As shown in FIG. 3A, local interconnect metal plates 322a, 324a, 322b, 324b are arranged in interdigitated fashion. In addition, FIG. 3A shows that local interconnect metal plates 322a and 322b are interconnected by capacitor runner 332 to form a MOM capacitor high terminal, while local interconnect metal plates 324a and 324b are interconnected by capacitor runner 334 to form a MOM capacitor low terminal. As further shown by FIG. 3A, capacitor runners 332 and 334 also share the plane shared by local interconnect metal plates 322a, 324a, 322b, 324b. However, capacitor runners 332 and 334 are formed so as to lie substantially perpendicular to local interconnect metal plates 322a, 324a, 322b, 324b in that plane.

According to the embodiment shown in FIGS. 3A and 3B, capacitor runners 332 and 334 are formed of a local interconnect metal. For example, comparison of FIG. 1 with FIGS. 3A and 3B reveals that, according to the present embodiment, capacitor runners 332 and 334 are formed from the same local interconnect metal used to form local interconnect metal body 130, in FIG. 1. As previously discussed, the local interconnect metal used to form local interconnect metal body 130 may serve a specific function at a particular technology node. Using the 20 nm node again as an example, a local interconnect metal used to form local interconnect metal body 130 may typically be utilized in an MEOL process as gate connections for devices formed in device layer 102. According to embodiments of the present invention, however, a local interconnect metal, e.g., the local interconnect metal used to form local interconnect metal body 120, can be advantageously used to fabricate local interconnect metal plates 322a, 324a, 322b, and 324b of a MOM capacitor, while another local interconnect metal, e.g., the local interconnect metal used to form local interconnect metal body 130, can be further advantageously used to fabricate capacitor runners 332 and 334 for interconnecting local interconnect metal plates 322a and 322b, and 324a and 324b, respectively. Furthermore, as was the case for the embodiments shown in FIGS. 1, 2A, and 2B, the process for forming the embodiments of FIGS. 3A and 3B is compatible with standard fabrication processes for advanced process technologies.

Figure 4A:
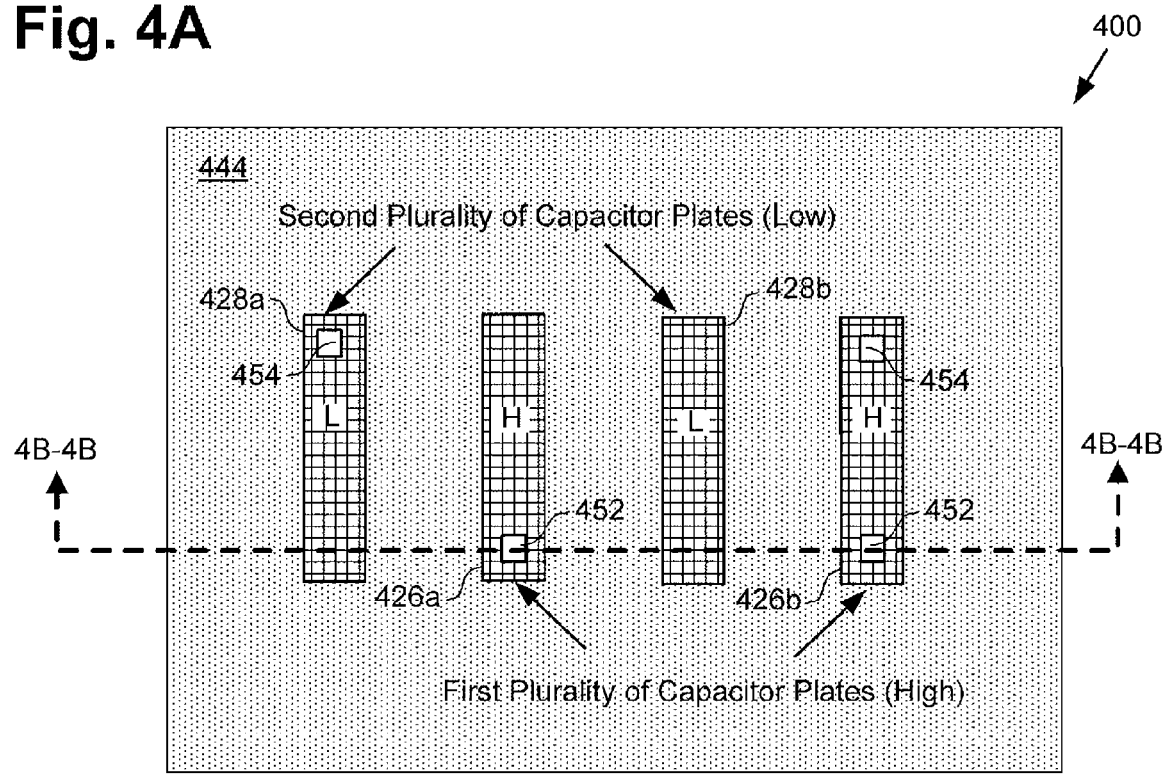
FIG. 4A shows a top view of a portion of a semiconductor die including a MOM capacitor having local interconnect metal plates, according to another embodiment of the present invention.
Figure 4B:
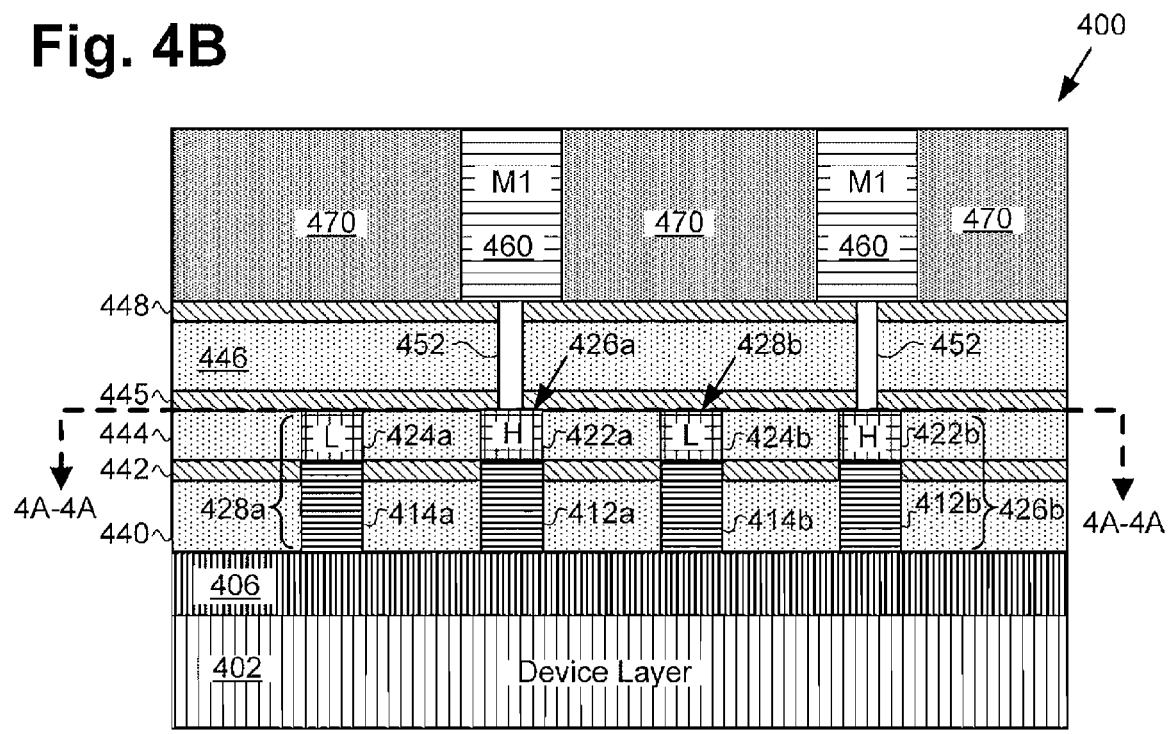
FIG. 4B shows a cross-sectional view of the embodiment of FIG. 4A along perspective line 4B-4B in FIG. 4A.

Referring to FIGS. 4A and 4B, FIG. 4A shows a top view of structure 400 corresponding to a portion of a semiconductor die including a MOM capacitor having local interconnect metal plates 426a, 428a, 426b, and 428b, according to another embodiment of the present invention, while FIG. 4B shows a cross-sectional view of structure 400 along perspective line 4B-4B in FIG. 4A. FIG. 4B also shows perspective line 4A-4A corresponding to the top view shown in FIG. 4A.

In addition to local interconnect metal plates 426a, 428a, 426b, and 428b, FIG. 4A shows a top surface of local interlayer dielectric 444, cross-sections of vias 452 at substantially their respective points of contact with local interconnect metal plates 426a and 426b, and cross-sections of vias 454 at substantially their respective points of contact with local interconnect metal plates 428a and 428b. Local interlayer dielectric 444, vias 452, and vias 454 correspond respectively to local interlayer dielectric 244, vias 252, and vias 254, in FIGS. 2A and 2B. Moreover, it is noted that device layer 402, isolation region 406, local interlayer dielectrics 440, 442, 445, 446, and 448, first metallization segments 460, and dielectric bodies 470 of structure 400, and shown in FIG. 4B, correspond respectively to device layer 202, isolation region 206, local interlayer dielectrics 240, 242, 245, 246, and 248, first metallization segments 260, and dielectric bodies 270, in FIG. 2B, and may share the characteristics previously attributed to those features, as described above.

Like local interconnect metal plates 222a, 224a, 222b, and 224b, in FIGS. 2A and 2B, local interconnect metal plates 426a, 428a, 426b, and 428b, in FIGS. 4A and 4B share a common plane parallel to and below the plane of a first metallization layer from which first metallization segments 460 are formed. In addition, however, and as shown in FIG. 4B, local interconnect metal plates 426a, 428a, 426b, and 428b are formed of local interconnect metal stacks including local interconnect metal bodies 422a, 424a, 422b, and 424b, respectively, formed over respective lower local interconnect metal bodies 412a, 414a, 412b, and 414b. Comparison of FIG. 1 with FIGS. 4A and 4B reveals that, according to the present embodiment, lower local interconnect metal bodies 412a, 414a, 412b, and 414b, in FIG. 4B, are formed from the same lower local interconnect metal used to form lower local interconnect metal body 110, in FIG. 1, while local interconnect metal bodies 422a, 424a, 422b, and 424b, in FIG. 4B, are formed from the same local interconnect metal used to form local interconnect metal body 120, in FIG. 1. Thus, local interconnect metal plates 426a, 428a, 426b, and 428a of the MOM capacitor embodied in FIGS. 4A and 4B may be formed from a local interconnect metal stack typically utilized in an MEOL process to provide source/drain connections for devices formed in device layer 402. Consequently, as was the case for the embodiments shown in FIGS. 1, 2A, 2B, 3A, and 3B, the process for forming the embodiment shown by FIGS. 4A and 4B is compatible with standard CMOS fabrication process flows.

According to the embodiment of FIGS. 4A and 4B, and as further shown by FIG. 4B, the dielectric serving as the capacitor dielectric between local interconnect metal plates 526a and 528a and between local interconnect metal plates 526b and 528b is provided by a combination of local interlayer dielectrics 440, 442, and 444. Thus, in embodiments in which local interlayer dielectrics 440, 442, and 444 comprise alternating $SiO_2$ and $Si_3N_4$ layers, for example, the MOM capacitor dielectric may comprise a combination of $SiO_2$ and $Si_3N_4$ and thus may have a dielectric constant greater than approximately 3.9 and less than approximately 7.0. Moreover, in one embodiment, the MOM capacitor dielectric implemented as part of the present invention may have a dielectric constant greater than or equal to approximately 3.9 and less than approximately 5.0.

Figure 5A:
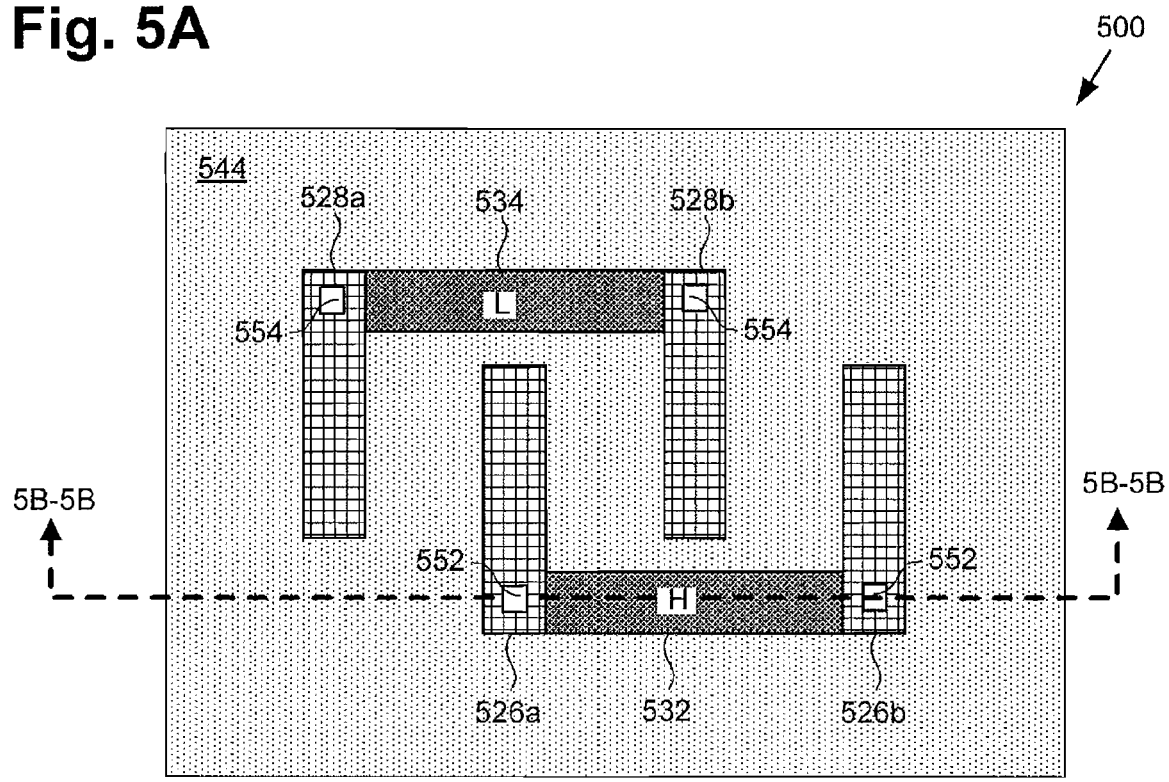
FIG. 5A shows a top view of a portion of a semiconductor die including a MOM capacitor having local interconnect metal plates, according to another embodiment of the present invention.
Figure 5B:
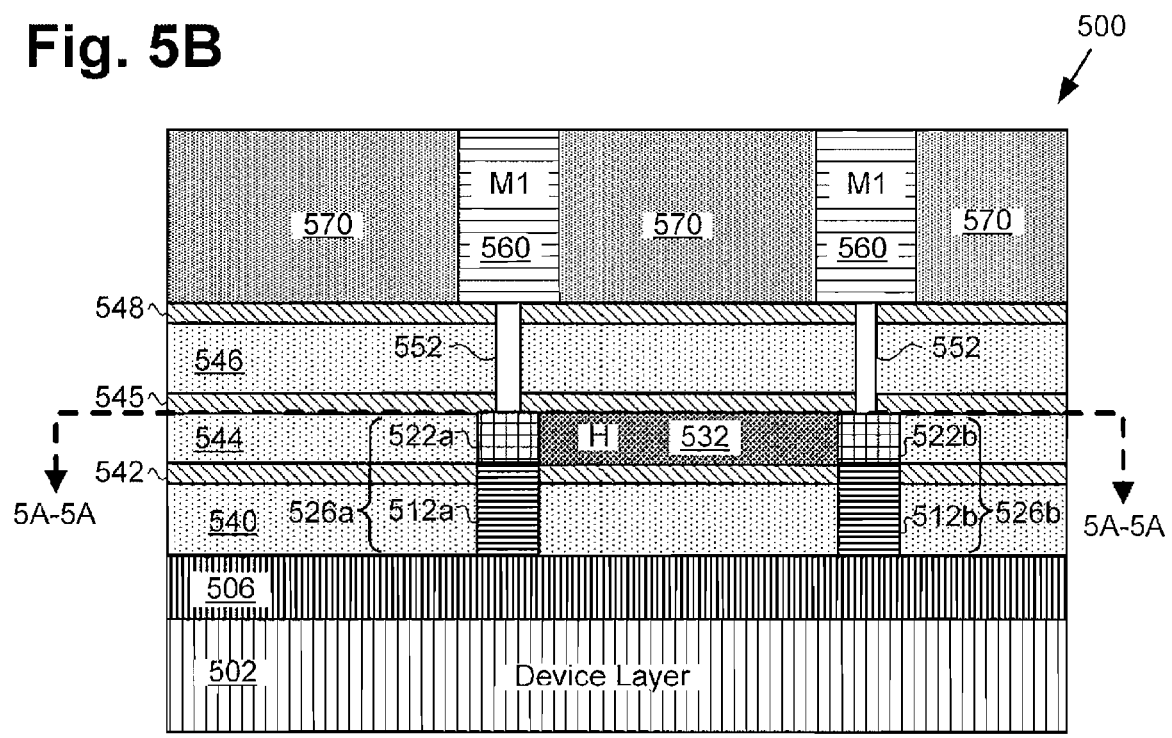
FIG. 5B shows a cross-sectional view of the embodiment of FIG. 5A along perspective line 5B-5B in FIG. 5A.

Continuing to FIGS. 5A and 5B, FIG. 5A shows a top view of structure 500 corresponding to a portion of a semiconductor die including a MOM capacitor having local interconnect metal plates 526a, 528a, 526b, and 528b, according to another embodiment of the present invention, while FIG. 5B shows a cross-sectional view of structure 500 along perspective line 5B-5B in FIG. 5A. FIG. 5B also shows perspective line 5A-5A corresponding to the top view shown in FIG. 5A.

In addition to local interconnect metal plates 526a, 528a, 526b, and 528b, FIG. 5A shows a top surface of local interlayer dielectric 544, cross-sections of vias 552 at substantially their respective points of contact with local interconnect metal plates 526a and 526b, and cross-sections of vias 554 at substantially their respective points of contact with local interconnect metal plates 528a and 528b, as well as capacitor runner 532 interconnecting local interconnect metal plates 526a and 526b, and capacitor runner 534 interconnecting local interconnect metal plates 528a and 528b.

As shown in FIG. 5B, local interconnect metal plates 526a and 526b are formed of local interconnect metal stacks including local interconnect metal bodies 522a and 522b, respectively, formed over respective lower local interconnect metal bodies 512a and 512b. It is noted that although local interconnect metal plates 528a and 528b are not visible in cross-section in FIG. 5B, according to the present embodiment, local interconnect metal plates 528a and 528b are formed similarly to local interconnect metal plates 526a and 526b, and comprise a local interconnect metal body formed over a lower local interconnect metal body. In other words local interconnect metal plates 526a, 528a, 526b, and 528b correspond respectively to local interconnect metal plates 426a, 428a, 426b, and 428b, in FIG. 4B.

Local interlayer dielectric 544, vias 552, and vias 554 correspond respectively to local interlayer dielectric 444, vias 452, and vias 454, in FIGS. 4A and 4B. Moreover, it is noted that device layer 502, isolation region 506, local interlayer dielectrics 540, 542, 545, 546, and 548, first metallization segments 560, and dielectric bodies 570 of structure 500, in FIG. 5B, correspond respectively to device layer 402, isolation region 406, local interlayer dielectrics 440, 442, 445, 446, and 448, first metallization segments 460, and dielectric bodies 470, in FIG. 4B, and may share the characteristics previously attributed to those features, as described above.

As shown in FIG. 5A, local interconnect metal plates 526a, 528a, 526b, 528b are arranged in interdigitated fashion. In addition, FIG. 5A shows that local interconnect metal plates 526a and 526b are interconnected by capacitor runner 532 to form a MOM capacitor high terminal, while local interconnect metal plates 528a and 528b are interconnected by capacitor runner 534 to form a MOM capacitor low terminal. Capacitor runners 532 and 534 correspond respectively to capacitor runners 332 and 334 in FIGS. 3A and 3B, and like capacitor runners 332 and 334 are formed from a local interconnect metal.

Thus, as discussed above, the present invention provides a MOM capacitor that utilizes one or more local interconnect metals, such as copper or a refractory metal such as tungsten, for example, to form capacitor plates, and utilizes a local interlayer dielectric, such as $Si_3N_4$ and/or $SiO_2$ as the MOM capacitor dielectric. As a result, embodiments of the present MOM capacitor having local interconnect metal plates can be advantageously formed using established CMOS process flows during MEOL processing, without requiring substantial additional processing steps. Moreover, embodiments of the present invention provide a MOM capacitor having an increased capacitance density compared to that achieved by conventional MOM capacitors fabricated between routing metallization layers during BEOL processing.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A metal-oxide-metal (MOM) capacitor in a semiconductor die, said MOM capacitor comprising:
a first plurality of capacitor plates and a second plurality of capacitor plates in a MOM capacitor region situated laterally adjacent a transistor region, said first and second plurality of capacitor plates sharing a plane parallel to and below a plane of a first metallization layer of said semiconductor die;
a local interlayer dielectric between said first plurality of capacitor plates and said second plurality of capacitor plates; and
said first and second plurality of capacitor plates comprised of a local interconnect metal for connecting devices formed in a device layer situated below said first metallization layer, wherein said first and second plurality of capacitor plates do not overlie said transistor region, said first and second plurality of capacitor plates are formed at a same layer as a local interconnect metal body which provides a direct connection to a gate in the transistor region, the gate being formed on a gate dielectric layer, and at least one dielectric layer is disposed below the plurality of capacitor plates and between the local interlayer dielectric and a dielectric layer in which the gate is formed, the dielectric layer in which the gate is formed being separate from the gate dielectric layer.

2. The MOM capacitor of claim 1, further comprising a first capacitor runner for interconnecting said first plurality of capacitor plates, and a second capacitor runner for interconnecting said second plurality of capacitor plates, said first and second capacitor runners comprising another local interconnect metal for providing connections among said devices formed in said device layer.

3. The MOM capacitor of claim 1, wherein said first plurality of capacitor plates further comprise a lower local interconnect metal, and said second plurality of capacitor plates further comprise said lower local interconnect metal.

4. The MOM capacitor of claim 3, further comprising a first capacitor runner for interconnecting said first plurality of capacitor plates, and a second capacitor runner for interconnecting said second plurality of capacitor plates, said first and second capacitor runners comprising another local interconnect metal for providing connections among said devices formed in said device layer.

5. The MOM capacitor of claim 1, wherein said local interconnect metal comprises a refractory metal.

6. The MOM capacitor of claim 1, wherein said local interconnect metal comprises copper.

7. The MOM capacitor of claim 1, wherein said local interlayer dielectric comprises silicon oxide.

8. The MOM capacitor of claim 1, wherein said local interlayer dielectric comprises silicon nitride.

9. The MOM capacitor of claim 1, wherein said local interlayer dielectric has a dielectric constant greater than or equal to approximately 3.9 and less than approximately 5.0.

10. The MOM capacitor of claim 1, wherein said first and second plurality of capacitor plates are situated over an isolation region formed in said device layer.

\* \* \* \* \*